US012648386B2

(12) United States Patent
Chang et al.

(10) Patent No.: US 12,648,386 B2
(45) Date of Patent: Jun. 2, 2026

(54) METHOD OF DEPOSITION IN HIGH ASPECT RATIO (HAR) FEATURES

(71) Applicant: Tokyo Electron Limited, Tokyo (JP)

(72) Inventors: Shihsheng Chang, Albany, NY (US); Yen-Tien Lu, Albany, NY (US); Du Zhang, Albany, NY (US); David L O'Meara, Albany, NY (US); Jeffrey Shearer, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 206 days.

(21) Appl. No.: 18/337,281

(22) Filed: Jun. 19, 2023

(65) Prior Publication Data

US 2024/0420965 A1 Dec. 19, 2024

(51) Int. Cl.
| | |
|---|---|
| *H01L 21/311* | (2006.01) |
| *C23C 16/30* | (2006.01) |
| *C23C 16/44* | (2006.01) |
| *C23C 16/455* | (2006.01) |
| *H01L 21/3065* | (2006.01) |

(52) U.S. Cl.
CPC ...... *H01L 21/31144* (2013.01); *C23C 16/303* (2013.01); *C23C 16/4408* (2013.01); *C23C 16/45536* (2013.01); *C23C 16/45553* (2013.01); *H01L 21/3065* (2013.01); *H01L 21/31116* (2013.01)

(58) Field of Classification Search
CPC .......................... H01L 21/3114; C23C 16/045
See application file for complete search history.

(56) References Cited

U.S. PATENT DOCUMENTS

| | | | |
|---|---|---|---|
| 8,043,432 | B2 | 10/2011 | Dip |
| 8,465,591 | B2 | 6/2013 | Kato et al. |
| 8,721,790 | B2 | 5/2014 | Kato et al. |
| 9,378,971 | B1 | 6/2016 | Briggs et al. |
| 9,543,148 | B1 * | 1/2017 | Hudson ............. H01L 21/67069 |
| 9,659,783 | B2 * | 5/2017 | Guha .................. H01L 21/3081 |
| 10,170,323 | B2 | 1/2019 | Hudson et al. |
| 10,170,324 | B2 * | 1/2019 | Dole ................. H01J 37/32137 |
| 10,770,294 | B2 | 9/2020 | O'Meara et al. |

(Continued)

OTHER PUBLICATIONS

International Search Report and Written Opinion, PCT Application No. PCT/US2024/020653, mailed Jul. 8, 2024, 13 pages.

(Continued)

*Primary Examiner* — Mounir S Amer
(74) *Attorney, Agent, or Firm* — Slater Matsil, LLP

(57) ABSTRACT

A method for processing a substrate that includes: patterning a carbon-based hardmask layer over a dielectric layer to form a first recess in the carbon-based hardmask layer, the first recess having a tapered profile such that a width of the first recess at a first height is greater than a width of the first recess at a second height that is lower than the first height; depositing a metal-containing layer over the patterned carbon-based hardmask layer, the metal-containing layer being physically in contact with sidewalls of the patterned carbon-based hardmask layer in the first recess, the metal-containing layer being thicker at the first height than at the second height; and etching the dielectric layer using the patterned carbon-based hardmask layer as an etch mask by an anisotropic plasma etch process to form a second recess in the dielectric layer.

23 Claims, 9 Drawing Sheets

(56)         References Cited

U.S. PATENT DOCUMENTS

| | | | |
|---|---|---|---|
| 11,152,217 B2 | 10/2021 | Tsai et al. | |
| 11,810,791 B2 * | 11/2023 | Sasagawa | ......... H01L 21/31144 |
| 12,278,114 B2 * | 4/2025 | Wan | ................. H01L 21/02164 |
| 2012/0276747 A1 * | 11/2012 | Oh | ................... H01L 21/31138 |
| | | | 438/723 |
| 2017/0247794 A1 | 8/2017 | Mukae | |
| 2021/0313166 A1 | 10/2021 | Wu et al. | |
| 2021/0391181 A1 | 12/2021 | Chang | |
| 2022/0020642 A1 | 1/2022 | Sun et al. | |
| 2022/0189786 A1 | 6/2022 | Lin | |
| 2022/0199417 A1 | 6/2022 | Henri | |
| 2022/0399212 A1 | 12/2022 | Kumakura | |
| 2025/0046603 A1 * | 2/2025 | Zhang | .............. H01L 21/31116 |

OTHER PUBLICATIONS

Cardinaud, Christophe, et al., "Plasma etching: principles, mechanisms, application to micro- and nano-technologies," Applied Surface Science 164, Sep. 2000, pp. 72-83.

* cited by examiner

140

120

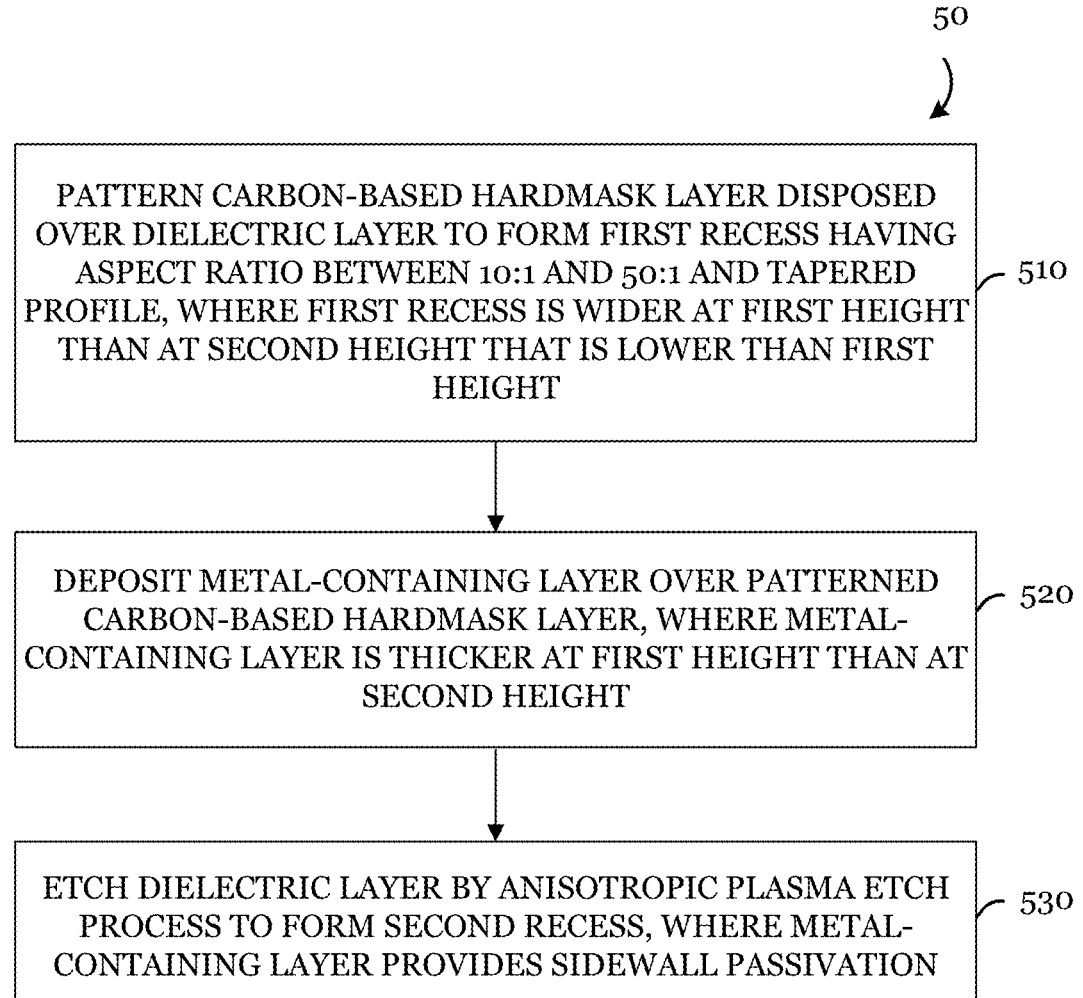

50

PATTERN CARBON-BASED HARDMASK LAYER DISPOSED OVER DIELECTRIC LAYER TO FORM FIRST RECESS HAVING ASPECT RATIO BETWEEN 10:1 AND 50:1 AND TAPERED PROFILE, WHERE FIRST RECESS IS WIDER AT FIRST HEIGHT THAN AT SECOND HEIGHT THAT IS LOWER THAN FIRST HEIGHT — 510

DEPOSIT METAL-CONTAINING LAYER OVER PATTERNED CARBON-BASED HARDMASK LAYER, WHERE METAL-CONTAINING LAYER IS THICKER AT FIRST HEIGHT THAN AT SECOND HEIGHT — 520

ETCH DIELECTRIC LAYER BY ANISOTROPIC PLASMA ETCH PROCESS TO FORM SECOND RECESS, WHERE METAL-CONTAINING LAYER PROVIDES SIDEWALL PASSIVATION — 530

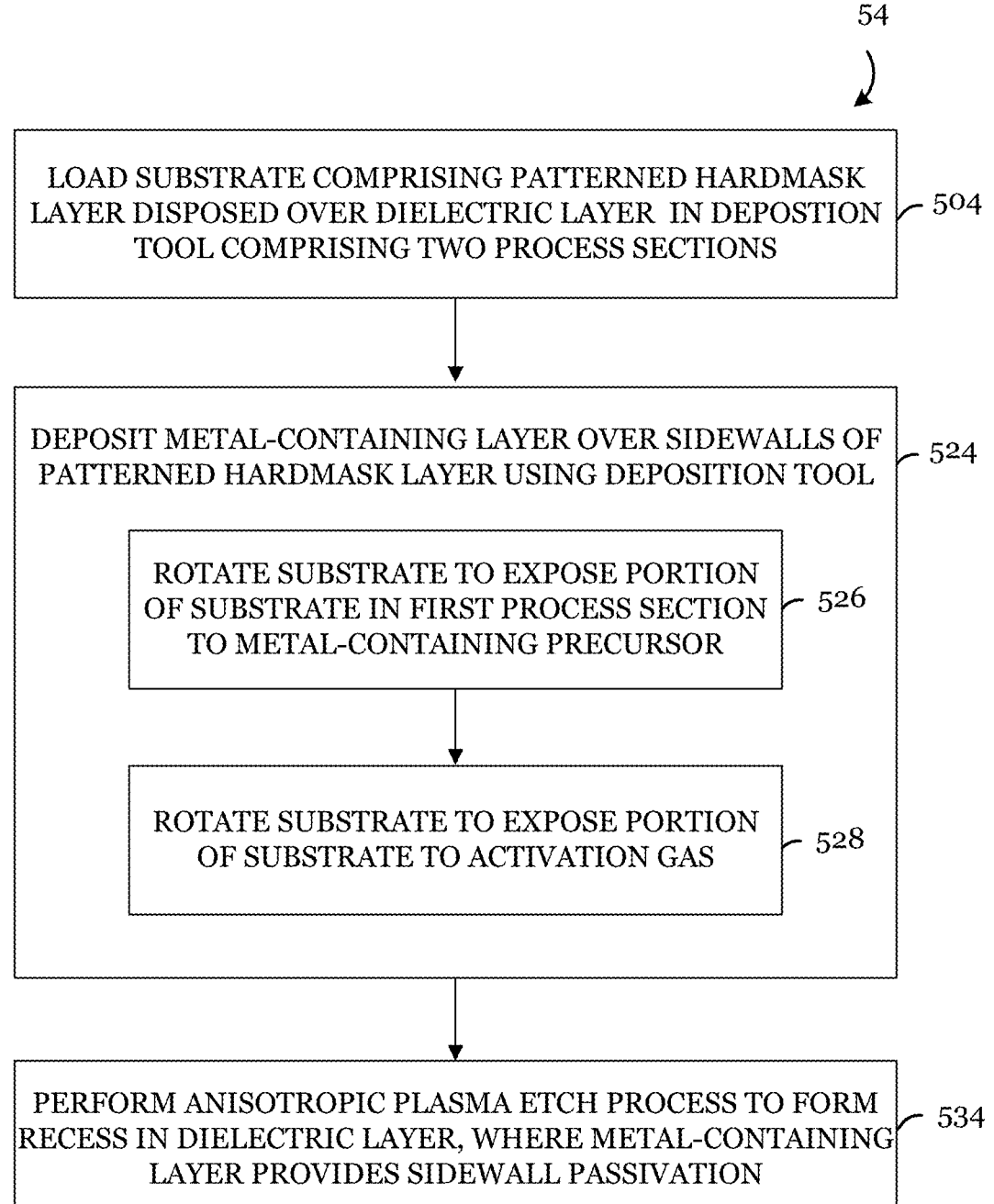

LOAD SUBSTRATE COMPRISING PATTERNED HARDMASK LAYER DISPOSED OVER DIELECTRIC LAYER IN DEPOSTION TOOL COMPRISING TWO PROCESS SECTIONS — 504

DEPOSIT METAL-CONTAINING LAYER OVER SIDEWALLS OF PATTERNED HARDMASK LAYER USING DEPOSITION TOOL — 524

ROTATE SUBSTRATE TO EXPOSE PORTION OF SUBSTRATE IN FIRST PROCESS SECTION TO METAL-CONTAINING PRECURSOR — 526

ROTATE SUBSTRATE TO EXPOSE PORTION OF SUBSTRATE TO ACTIVATION GAS — 528

PERFORM ANISOTROPIC PLASMA ETCH PROCESS TO FORM RECESS IN DIELECTRIC LAYER, WHERE METAL-CONTAINING LAYER PROVIDES SIDEWALL PASSIVATION — 534

FIG. 5C

METHOD OF DEPOSITION IN HIGH ASPECT RATIO (HAR) FEATURES

TECHNICAL FIELD

The present invention relates generally to methods of processing a substrate, and, in particular embodiments, to deposition in high aspect ratio (HAR) features.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

The semiconductor industry has repeatedly reduced the minimum feature sizes in semiconductor devices to a few nanometers to increase the packing density of components. Accordingly, the semiconductor industry increasingly demands plasma processing technology to provide processes for patterning features with accuracy, precision, and profile control, often at atomic scale dimensions. Meeting this challenge along with the uniformity and repeatability needed for high volume IC manufacturing requires further innovations of plasma processing technology.

SUMMARY

In accordance with an embodiment of the present invention, a method for processing a substrate that includes: patterning a carbon-based hardmask layer disposed over a dielectric layer of a substrate to form a first recess in the carbon-based hardmask layer, the first recess having a tapered profile such that a width of the first recess at a first height is greater than a width of the first recess at a second height that is lower than the first height; depositing a metal-containing layer over the patterned carbon-based hardmask layer, the metal-containing layer being physically in contact with sidewalls of the patterned carbon-based hardmask layer in the first recess, the metal-containing layer being thicker at the first height than at the second height; and after depositing the metal-containing layer, etching the dielectric layer using the patterned carbon-based hardmask layer as an etch mask by an anisotropic plasma etch process to form a second recess in the dielectric layer.

In accordance with an embodiment of the present invention, a method for processing a substrate that includes: patterning a carbon-based hardmask layer disposed over a dielectric layer of a substrate to form a first recess in the carbon-based hardmask layer, the first recess having an aspect ratio between 10:1 and 50:1; performing an initial etch process using the patterned carbon-based hardmask layer as an etch mask to form a second recess in the dielectric layer; performing an atomic layer deposition (ALD) process to deposit a metal-containing layer over sidewalls of the patterned carbon-based hardmask layer and the dielectric layer; and after the ALD process, performing a main etch process to extend the second recess in the dielectric layer, the metal-containing layer providing sidewall passivation during the main etch.

In accordance with an embodiment of the present invention, a method for processing a substrate that includes:

loading the substrate in a deposition tool including two process sections, the substrate including a patterned hardmask layer disposed over a dielectric layer; depositing a metal-containing layer over sidewalls of the patterned hardmask layer using the deposition tool, the depositing including rotating the substrate at a rotation speed such that at least a portion of the substrate pass through first and second process sections of the deposition tool per rotation, the rotating including exposing the portion of the substrate in the first process section to a metal-containing precursor to deposit the metal-containing precursor over the sidewalls, and exposing the portion of the substrate in the second process section to an activation gas to convert the metal-containing precursor to the metal-containing layer; and performing an anisotropic plasma etch process using the patterned hardmask layer to form a recess in the dielectric layer, the metal-containing layer providing sidewall passivation during the anisotropic plasma etch process.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate cross sectional views of a substrate during an example process of semiconductor fabrication comprising a plasma etch process to form a high aspect ratio (HAR) feature on the substrate in accordance with various embodiments, wherein FIG. 1A illustrates an incoming substrate comprising an underlying layer, a material layer, and a patterned mask layer, FIG. 1B illustrates the substrate after an initial etch to form a recess in the material layer, FIG. 1C illustrates the substrate after a corrective deposition over the material layer, and FIG. 1D illustrates the substrate after a main etch to extend the recess in the underlying layer;

FIGS. 3A-3D illustrate cross sectional views of a substrate during an example process of semiconductor fabrication comprising a plasma etch process to form a high aspect ratio (HAR) feature on the substrate in accordance with alternate embodiments, wherein FIG. 3A illustrates the substrate after an partial etch to form an initial recess in the material layer, FIG. 3B illustrates the substrate after a corrective deposition over the material layer, FIG. 3C illustrates the substrate after completing the etching of the material layer to extend the initial recess, and FIG. 3D illustrates the substrate after a main etch to further extend the recess in the underlying layer;

FIGS. 4A-4D illustrate cross sectional views of a substrate during an example process of semiconductor fabrication comprising a plasma etch process to form a high aspect ratio (HAR) feature on the substrate in accordance with other embodiments, wherein FIG. 4A illustrates the substrate after an initial etch to form a recess in the material layer, a corrective deposition, and a partial main etch to extend the recess in the underlying layer, FIG. 4B illustrates the substrate after a conformal deposition, FIG. 4C illustrates the substrate after another main etch to extend the recess in the underlying layer, and FIG. 4D illustrates the substrate after completing the formation of the HAR feature and removing the material layer;

FIGS. 5A-5C illustrate process flow diagrams of methods of semiconductor fabrication comprising a plasma etch process to form a HAR feature in accordance with various embodiments, wherein FIG. 5A illustrates an embodiment, FIG. 5B illustrates an alternate embodiment, and FIG. 5C illustrates yet another embodiment;

FIGS. 7A and 7B illustrate a spatially segregated atomic layer deposition (ALD) system for performing a corrective deposition, illustrated in the flow diagram in FIG. 5C, wherein FIG. 7A illustrates a top view and FIG. 7B illustrates a cross-sectional view.

DETAILED DESCRIPTION OF ILLUSTRATIVE EMBODIMENTS

This application relates to fabrication of semiconductor devices, more particularly to deposition in high aspect ratio (HAR) features. The methods of deposition may be useful in fabricating high capacity three-dimensional (3D) memory devices, such as a 3D-NAND (or vertical-NAND), 3D-NOR, or dynamic random access memory (DRAM) device. The fabrication of such devices may generally require forming conformal, HAR features (e.g., a contact hole) of a circuit element. In such applications, HAR features may be formed in a dielectric layer (e.g., silicon oxide, silicon nitride, or oxide/nitride layer stack) by a highly anisotropic plasma etch process with high fidelity. To sufficiently etch the dielectric layer to form HAR features, an etch mask, for example, amorphous carbon layer (ACL) also needs be patterned with a HAR prior to etching the dielectric layer. However, the patterning of the etch mask prior to the dielectric etch often suffers from tapered profile, which causes problems in the subsequent dielectric etch through, for example, bowing. Therefore, an improved method for patterning the etch mask for HAR features may be desired. Embodiments of the present application disclose methods of corrective deposition of a metal-containing layer (e.g., aluminum oxide) over the etch mask material (e.g., ACL) that can correct the tapered profile of the patterned etch mask and also improve the mask selectivity.

Various embodiments of the methods can deposit the metal-containing layer non-conformally or conformally, and may be applied at various stages of HAR feature fabrication. Non-conformal deposition may be useful in correcting the shape of an already patterned etch mask layer prior to etching an underlying target dielectric layer (e.g., FIGS. 1A-1D and 3A-3D). Conformal deposition may be implemented during the process of etching the underlying target layer to provide additional sidewall passivation (e.g., FIGS. 4A-4D). The metal-containing layer may advantageously form a less volatile, etch-resistant layer, thus improving the mask selectivity during a halogen-based etch process.

The methods of corrective deposition described herein may be applied to various semiconductor device fabrication that requires HAR features. Features with aspect ratio (ratio of height of the feature to the width of the feature) higher than 10:1 are generally considered to be high aspect ratio features, and in some cases fabricating a higher aspect ratio such as 50:1 may be desired for advanced 3D semiconductor devices.

In the following, an exemplary plasma etch process to form a high aspect ratio (HAR) feature, including corrective deposition, is described in accordance with various embodiments referring to FIGS. 1A-1D, 2, and 3A-3D. Embodiments with additional conformal deposition during the plasma etch process are then described referring to FIGS.

Figure 5B:
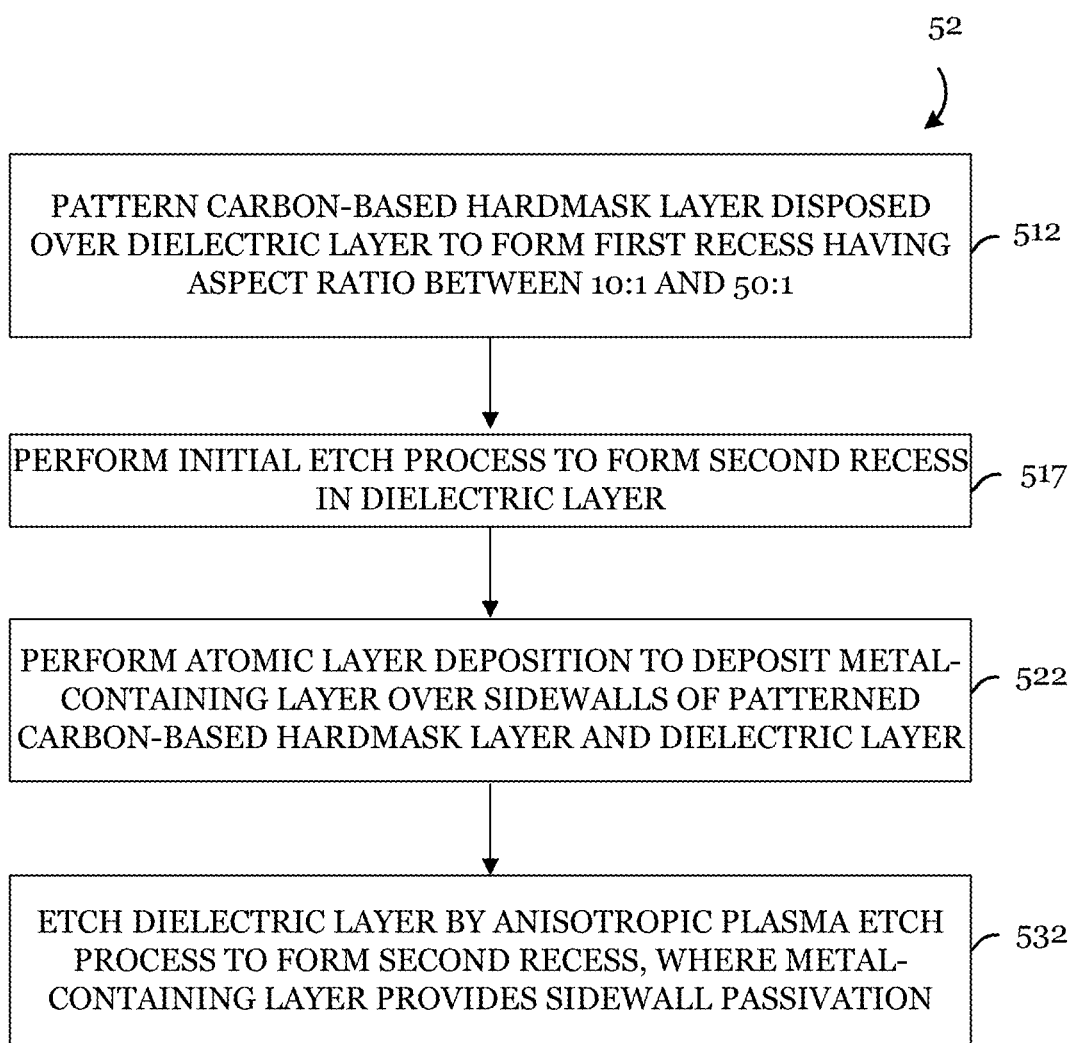
Figure 6:
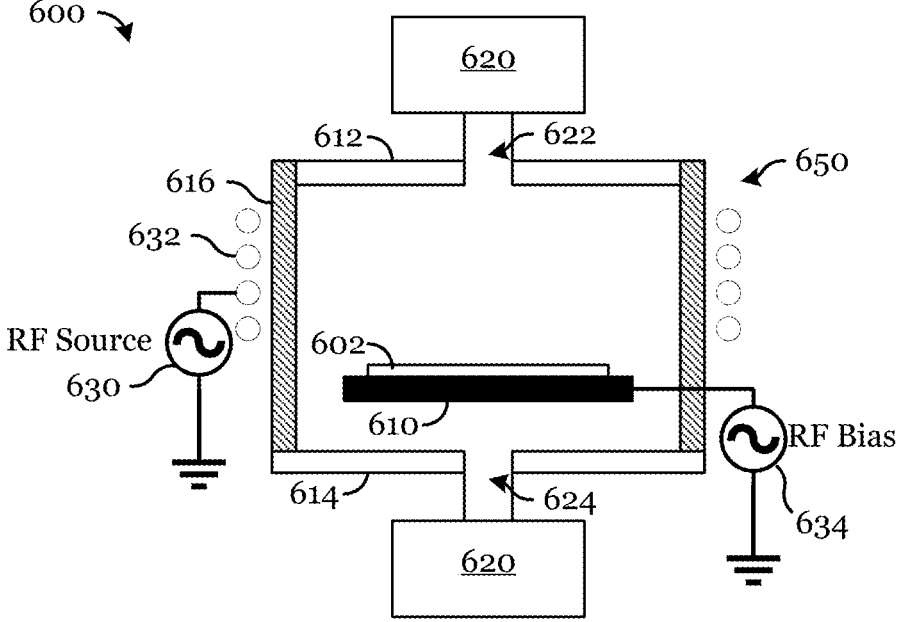
FIG. 6 illustrates a cross-sectional view of a plasma system for performing a corrective deposition in accordance with an embodiment.
Figure 7A:
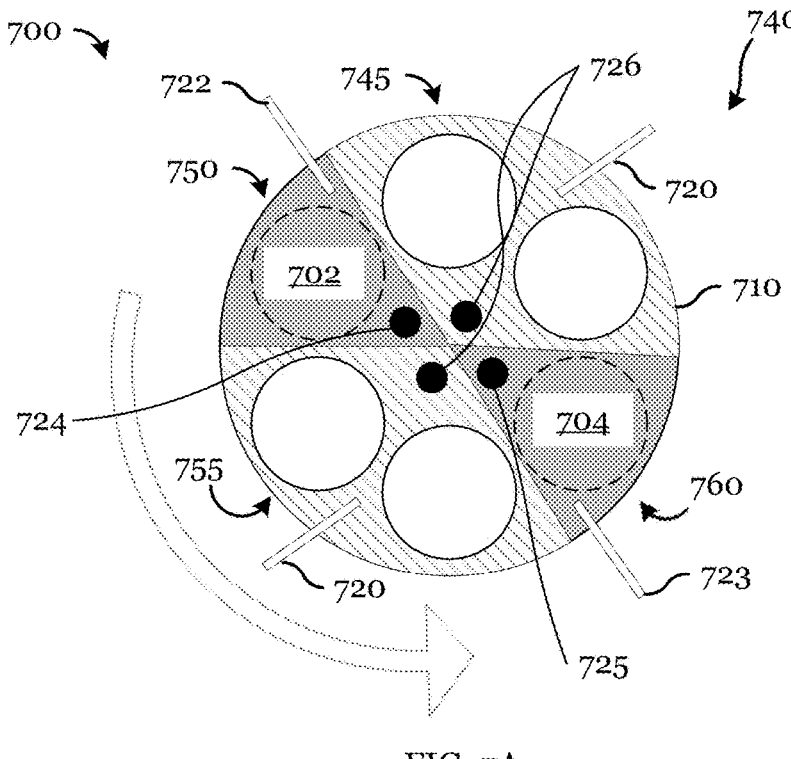
Figure 7B:
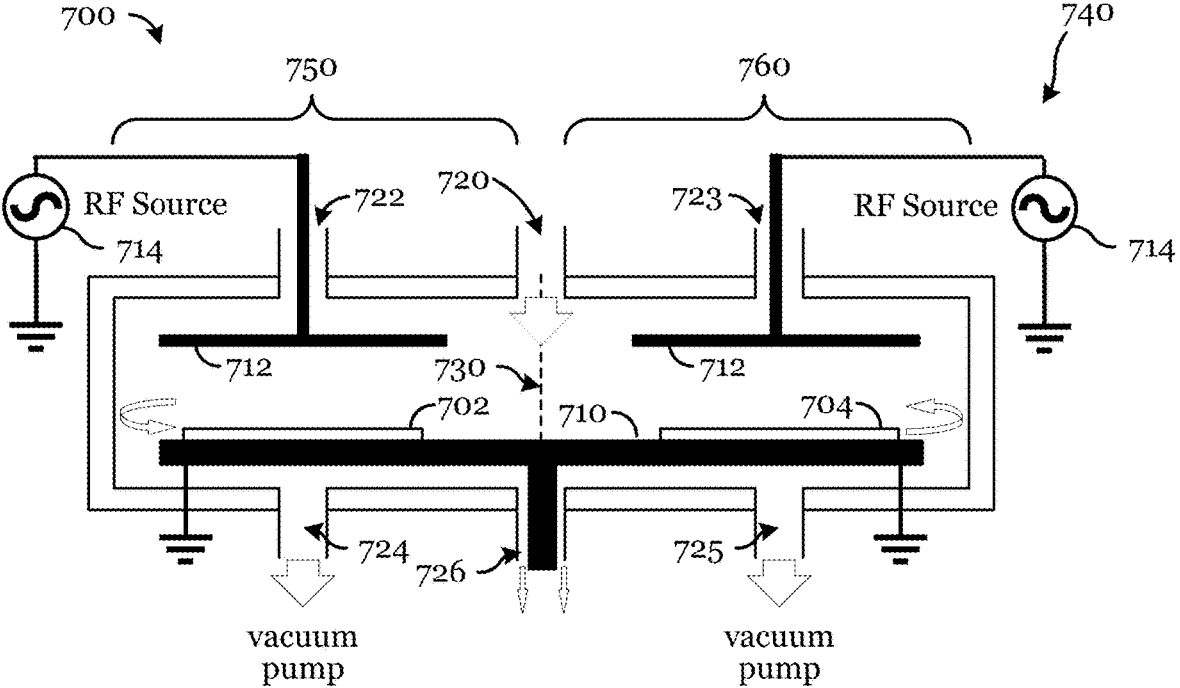

4A-4C. Example process flow diagrams are illustrated in FIG. 5A-5C. FIGS. 6, and 7A-7B provide example deposition systems for performing corrective deposition in accordance with various embodiments. All figures are drawn for illustration purpose only and not to scale, including the aspect ratios of features.

FIGS. 1A-1D illustrate cross sectional views of a substrate during an example process of semiconductor fabrication comprising a plasma etch process to form a high aspect ratio (HAR) feature on the substrate in accordance with various embodiments.

Figure 1A:
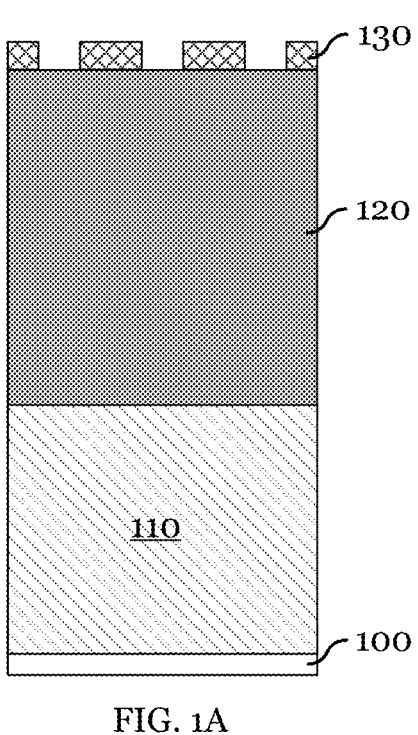

FIG. 1A illustrates a cross sectional view of an incoming substrate 100 comprising an underlying layer 110, a material layer 120, and a patterned mask layer 130.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of, or include, a semiconductor device, and may have undergone a number of steps of processing following, for example, a conventional process. For example, the semiconductor structure may comprise a substrate 100 in which various device regions are formed. At this stage, the substrate 100 may include isolation regions such as shallow trench isolation (STI) regions as well as other regions formed therein. Accordingly, the substrate 100 is used to collectively refer to any structures formed therein.

Figure 1B:
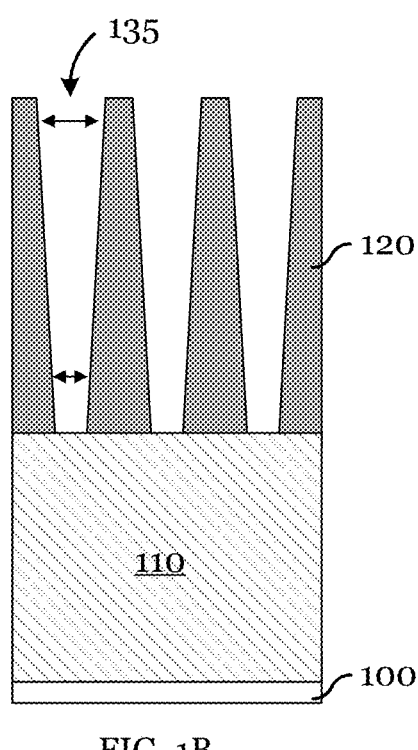
Figure 1C:
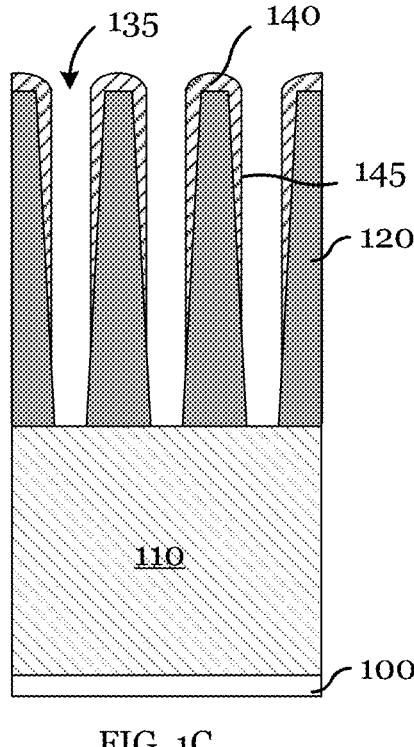

The underlying layer 110 may be formed over the substrate 100. In various embodiments, the underlying layer 110 is a target layer that is to be patterned by a subsequent plasma etch process (FIG. 1D) after patterning the material layer 120 (FIGS. 1B-1C). In certain embodiments, the feature being etched into the underlying layer 110 may be a contact hole, slit, or other suitable structures comprising a recess. In various embodiments, the underlying layer 110 may comprise a dielectric material. In certain embodiments, the underlying layer 110 may be a silicon oxide layer. In alternate embodiments, the underlying layer 110 may comprise silicon nitride, silicon oxynitride, or an O/N/O/N layer stack (stacked layers of oxide and nitride). The underlying layer 110 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the underlying layer 110 has a thickness between 1 μm and 10 μm.

Figure 1D:
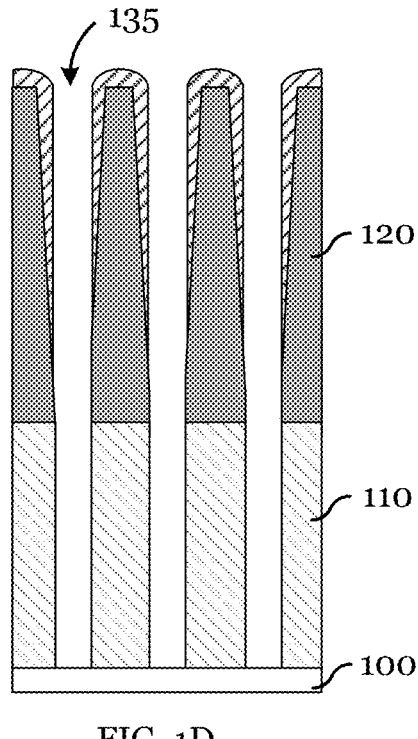

Still referring to FIG. 1A, the material layer 120 is formed over the underlying layer 110. In various embodiments, the material layer 120 may comprise amorphous carbon layer (ACL). In certain embodiments, the material layer 120 may comprise a layer stack of multiple mask materials (e.g., soft ACL and hard ACL). The material layer 120 may be deposited using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The relative thicknesses of the material layer 120 and the underlying layer 110 may have any suitable relationship. For example, the material layer 120 may be thicker than the underlying layer 110, thinner than the underlying layer 110, or the same thickness as the underlying layer 110. In certain embodiments, the material layer 120 has a thickness between 1 μm and 5 μm. In one embodiment, the material layer 120 comprises amorphous carbon layer (ACL) and has a thickness of 2.5 μm. In various embodiments, the material layer 120 is the layer to be patterned to form a patterned hardmask layer (FIGS. 1B-1C) that may be used as an etch mask for the subsequent plasma etch process to etch the underlying layer 110 (FIG. 1D).

Further illustrated in FIG. 1A, the substrate 100 may comprise the patterned mask layer 130 over the material layer 120. In various embodiments, the patterned mask layer 130 may comprise a silicon mask material, such as silicon oxynitride (SiON). The patterned mask layer 130 may be formed by first depositing a mask layer using, for example, an appropriate vapor deposition technique such as chemical vapor deposition (CVD), physical vapor deposition (PVD), atomic layer deposition (ALD), as well as other plasma processes such as plasma enhanced CVD (PECVD) and other processes. The deposited mask layer may then be patterned using a lithography process and an anisotropic etch process. In one embodiment, the patterned mask layer 130 may have a critical dimension (CD) between 50 nm and 200 nm, although in other embodiments, the CD of the patterned mask layer 130 may have any suitable value.

Although not specifically illustrated in FIG. 1A, the substrate 100 may also comprise other layers. For example, for the purpose of patterning the mask layer, a tri-layer structure comprising a photoresist (PR) layer, SiARC layer, and optical planarization layer (OPL) may be used. Accordingly, in one embodiment, the substrate 100 may comprise a multi-layer stack such as 50 nm PR/35 nm SiARC/400 nm organic planarization layer (OPL)/340 nm SiON. The PR may be first patterned by a lithographic process and then the pattern may be transferred to SiON, resulting in the patterned mask layer 130. In FIG. 1A, only the patterned mask layer 130 is illustrated for simplicity purpose.

FIG. 1B illustrates a cross sectional view of the substrate 100 after an initial etch to form a recess 135 in the material layer 120.

The initial etch to etch the material layer 120 using the patterned mask layer 130 as an etch mask may be performed by a plasma etch process, for example, reactive ion etching (RIE) based on $O_2$ etch chemistry. In various embodiments, an oxygen-containing gas such as dioxygen ($O_2$) may be used as a primary etch gas. In certain embodiments, other gases such as a noble gas and/or a balancing agent may also be added. In one embodiment, the initial etch may be performed using an inductively-coupled plasma (ICP) system. In certain embodiments, the patterned mask layer 130 may be completely consumed during the initial etch as illustrated in FIG. 1B, but in other embodiments, some residual materials from the mask layer material may be left over the material layer 120. In one or more embodiments, such residual materials may be removed by an optional treatment.

In various embodiments, the target aspect ratio for the recess 135 in the material layer 120 may be between 10:1 and 50:1, based on an average width of the recess 135. However, this HAR target makes it difficult for the initial etch to achieve a perfectly vertical, straight recess (i.e., perpendicular to the major surface of the underlying layer 110), resulting in a tapered or pointed profile of the material layer 120. As illustrated in FIG. 1B, the recess 135 may be tapered such that the width of the recess 135 is smaller at near the bottom than at near the top. In one embodiment, the width of the recess 135 at the bottom may be at least 10% smaller than that at the top.

The tapered or pointed profile of the material layer 120 as illustrated in FIG. 1B may not be ideal as an etch mask for the subsequent plasma etch process to etch the underlying layer 110. Although not wishing to be limited by any theory, this profile may adversely affect the directionality of reactive ions during the subsequent plasma etch process and leads to bowing issues. Further, with this profile of the material layer 120, their sidewalls may be subject to vertical ion bombardment, thus causing the undesired widening of the recess 135 during the subsequent plasma etch process. The inventors of this application identified that such a problematic profile may be corrected by a non-conformal (top preferential) deposition of a metal-containing layer as described below (FIG. 1C).

FIG. 1C illustrates a cross sectional view of the substrate 100 after a corrective deposition over the material layer 120.

The corrective deposition may non-conformally deposit a metal-containing layer 140 over the material layer 120. As illustrated in FIG. 1C, the metal-containing layer 140 may cover the top surface and an upper portion of sidewalls of the material layer 120 but not a lower portion of their sidewalls. In various embodiments, the metal-containing layer 140 may be in physical contact with the surface of the material layer 120, but in other embodiments, there may be an additional layer interposed between them. In this disclosure, "non-conformal" deposition is used to refer to a deposition where the formed layer does not have a uniform thickness across the deposited surface, and in various embodiments, the deposition may be top preferential, where the metal-containing layer 140 is thicker at a first height (e.g., at the top) than at a second height that is lower than the first height (e.g., at the middle).

This non-conformal feature of the metal-containing layer 140 can "correct" the shape and profile of the material layer 120 as the etch mask for a following step. Because more materials have been deposited over the upper portion of the material layer 120 with the tapered profile, corrected sidewalls 145 may be less tapered (i.e., more vertical) or even perpendicular to the major surface of the underlying layer 110. Thus, this deposition is referred to as "corrective" deposition in this disclosure.

Various metal elements and their compounds (e.g., metal oxide, metal nitride, or metal oxynitride) may be used for the metal-containing layer 140. In various embodiments, the metal-containing layer 140 may comprise a compound of aluminum (Al), titanium (Ti), or tantalum (Ta). In one or more embodiments, the metal-containing layer 140 may comprise aluminum oxide, aluminum nitride, or aluminum oxynitride. In various embodiments, the metal compound such as a metal oxide may be formed using a metal precursor, for example, trimethylaluminum (TMA) as an Al precursor or tetrakis(dimethylamino)titanium (TDMAT) as a Ti precursor and oxidation or nitridation of the metal precursor. In one or more embodiments, more than one metal element may be used. In various embodiments, the metal-containing layer 140 may be formed such that its removal at a later stage is feasible. Therefore, in certain embodiments, the formation of a highly crystallized material (e.g., sapphire) may be avoided and the metal compound may be formed primarily in an amorphous phase.

Since the subsequent plasma etch process may use halogen (e.g., fluorine) etch chemistry in certain embodiments, it is expected during the subsequent plasma etch process that the metal-containing layer 140 may react with the halogen to form a metal halide (e.g., metal fluoride). The metal halide with a low volatility under the etching conditions (e.g., $C_xF_y$ and/or $O_2$ etch chemistry) can advantageously provide passivation and thus improve the mask selectivity. Accordingly, the metal for the metal-containing layer 140 may be selected in view of the volatility of the corresponding metal halide.

The corrective deposition of the metal-containing layer 140 may be performed using an appropriate technique such as vapor deposition including chemical vapor deposition (CVD), physical vapor deposition (PVD), as well as plasma processes such as plasma enhanced CVD (PECVD) and other processes. The formation and deposition of the metal-containing layer 140 may be a plasma process or non-plasma process. Further, in certain embodiments, it may be performed using an atomic layer deposition (ALD) tool (e.g., FIGS. 7A-7B) but the process parameters may be adjusted to enable non-conformal deposition rather than conformal deposition for the purpose of correction of the etch mask profile (pseudo-ALD process). As further described below referring to FIGS. 7A-7B, the use of ALD tool, especially spatially segregated ALD tool, may be advantageous in controlling the degree of conformality of the deposition process by, for example, adjusting the spin rate of the substrate (e.g., a high spin rate to enable diffusion limited process for non-conformal layer growth). In one embodiment, the thickness of the metal-containing layer 140 at the top has a thickness between 1 nm and 20 nm. In one embodiment, after the corrective deposition, the width of the recess 135 at the top may be equal to or at most 10% greater than that at the bottom. For the pseudo-ALD or ALD process, the substrate may first be exposed first to a metal-containing precursor to deposit the metal-containing precursor, followed by an activation gas (e.g., oxidative gas) to convert the metal-containing precursor to the metal-containing layer (e.g., metal oxide). The composition of the activation gas may be selected in view of the target composition for the metal-containing layer, and in certain embodiments, comprise oxygen or nitrogen to form a metal oxide, metal nitride, or metal oxynitride.

Other process parameters for the corrective deposition may also be tuned to achieve a desired level of non-conformality of the metal-containing layer 140 (i.e., how much more deposition occurs near the top of the feature relative to at near the bottom). The inventors of this application have identified, for example, that diluting the gas comprising the metal precursor with an inert gas (e.g., $N_2$) can enhance the top preferential deposition by suppressing the diffusion of the metal precursor into recess features. Accordingly, the metal precursor concentration in the process gas may be selected in view of the level of non-conformality in various embodiments.

Figure 2:
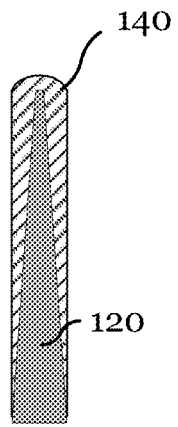
FIG. 2 illustrates a cross sectional view of a material layer after a corrective deposition in accordance with another embodiment.

FIG. 2 illustrates a cross sectional view of a material layer 120 after an initial etch and a corrective deposition to deposit a metal-containing layer 140 in accordance with another embodiment.

The process parameters of corrective deposition may be adjusted according to the initial shape and profile of the material layer 120. As illustrated in FIG. 2 as another example, the material layer 120 after the initial etch may have a profile with tapering greater than that in FIG. 1B. To compensate this greater level of tapering, the corrective deposition for the metal-containing layer 140 may be performed with more non-conformality (i.e., more top preferential deposition).

FIG. 1D illustrates a cross sectional view of the substrate after a main etch to extend the recess 135 in the underlying layer.

Referring back to FIG. 1D, after the corrective deposition, the main etch may be performed to etch the underlying layer 110 using the material layer 120 reshaped with the metal-containing layer 140 as an etch mask to form a high aspect ratio (HAR) feature by extending the recess 135. The main etch may comprise a plasma process such as reactive ion etching (RIE), and may use a halogen-containing etch gas. In various embodiments, the etch gas may comprise a fluorocarbon or a combination of a hydrocarbon and a fluorine-containing gas. In certain embodiments, the fluorocarbon may comprise hexafluorobutadiene ($C_4F_6$), hexafluoro-2-butyne ($C_4F_6$), or hexafluorocyclobutene ($C_4F_6$), octafluoropropane ($C_3F_8$), perfluorobutane ($C_4F_{10}$), or perflenapent ($C_5F_{12}$).

In certain embodiments, other gases such as a noble gas or a balancing agent may also be added to the process gas for the main etch. In this disclosure, any list that presents possible compositions, conditions, or process variations includes any reasonable combination thereof, and thus the term "or" used in the list does not indicate any exclusive selection of a particular composition, condition, or process variation. For example, in certain embodiments, argon (Ar) and dioxygen ($O_2$) may be included as the noble gas and the balancing agent, respectively. While above examples are primarily fluorine-based etch gases, other halogen-containing gases may also be used (e.g., $BCl_3$, $Cl_2$, and HBr).

As illustrated in FIG. 1D, the main etch may extend the recess 135 so that it reaches to the top surface of the substrate 100. Accordingly, the main etch in accordance with various embodiments may be tuned to provide a good selectivity to silicon (Si) in addition to the etch mask (e.g., the material layer 120 and the metal-containing layer 140). Consequently, the formation of the recess 135 may advantageously stop at the top surface of the substrate 100.

In various embodiments, the initial etch for the material layer 120 (FIG. 1B) may be performed in a plasma system (e.g., an inductively coupled plasma tool), and the main etch for the underlying layer 110 may be performed in another plasma system (e.g., a capacitively coupled plasma tool). In alternate embodiments, both two plasma etch processes may be performed in a same plasma system.

Owing to the corrected shape of the etch mask (i.e., the material layer 120 reshaped with the metal-containing layer 140), the main etch can extend the recess 135 with little or no bowing and enable straight, uniform HAR features in the underlying layer 110. Bowing may generally occur near the top of sidewalls of the etch target (e.g., the underlying layer 110), and may be caused by the bending of incident ion trajectories of ions used during the plasma etching process. Bowing may be eliminated or minimized by correcting the tapered profile of the material layer 120. Further, the low volatility of metal compounds and metal halide formed during the main etch can benefit the mask selectivity and provide side wall passivation.

In various embodiments, process parameters for the main etch may be selected to optimize the characteristics of the high aspect ratio (HAR) feature considering various factors comprising etch rate, selectivity to the etch mask, sidewall passivation in the HAR feature, and good critical dimension uniformity (CDU) among others. The process parameters may comprise gas selection, gas flow rates, pressure, temperature, process time, and plasma conditions such as source power, bias power, RF pulsing conditions.

In one or more embodiments, the etch mask may be completely consumed by the main etch. In other embodiments, as illustrated in FIG. 1D, there may be some residual etch mask remaining over the substrate 100. In certain embodiments, an optional removal step, for example, a wet process may be performed to remove this residual etch mask. In one embodiment, a cleaning solution based on a mixture of phosphoric, acetic, and nitric acids (PAN) may be used to remove the material comprising aluminum. Further, a dry ashing process may be used to remove carbon-based etch mask such as amorphous carbon layer (ACL).

The recess 135 may be in any shapes and structures, including a contact hole, slit, or other suitable structures comprising a recess useful for semiconductor device fabrication. In various embodiments, the features defined by the recess 135 has a critical dimension (CD) of 200 nm or less. In certain embodiments, the CD may be between 50 nm and 200 nm. For example, the feature may comprise a slit with a CD of about 150 nm. In alternate embodiments, the recess 135 may comprise a hole that has a top opening with a diameter of 80 nm or less.

FIGS. 3A-3D illustrate cross sectional views of a substrate during an example process of semiconductor fabrication comprising a plasma etch process to form a high aspect ratio (HAR) feature on the substrate in accordance with alternate embodiments.

In prior embodiments illustrated in FIGS. 1A-1D, the corrective deposition is performed after completing the initial etch for the etch mask (e.g., the material layer 120) and before the main etch for the target layer (e.g., the underlying layer 110). In other embodiments, the corrective deposition may be performed at a different stage of the process flow, for example, as an intermediate step inserted during the initial etch (FIGS. 3A-3D).

Figure 3A:
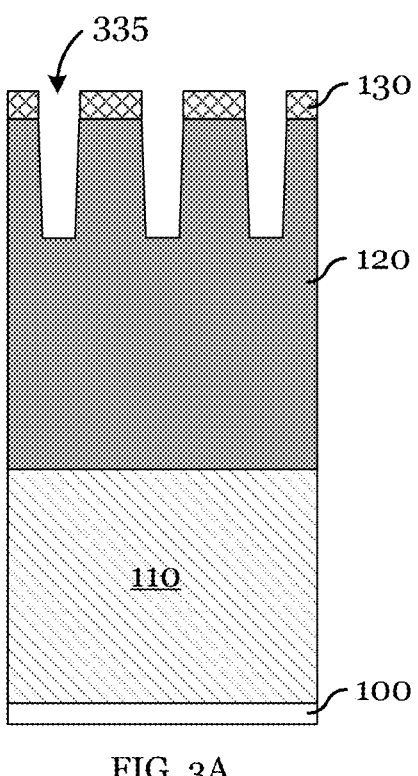

FIG. 3A illustrates a cross sectional view of a substrate 100 after a partial etch to form an initial recess 335 in a material layer 120. In FIG. 3A, the substrate 100 may comprises an underlying layer 110, the material layer 120, and a patterned mask layer 130. The details of these layers may be identical to those described referring to FIG. 1A, and will not be repeated.

In FIG. 3A, unlike the prior embodiments, the etch process to etch the material layer 120 may be first performed as the partial etch to only form the initial recess 335 that does not reach the underlying layer 110. In various embodiments, the partial etch may be performed using reactive ion etching (RIE), as previously described for the initial etch, but for example with a shorter process time. Because the initial recess 335 is shorter than the actual target depth of the initial etch (e.g., the depth of the recess 135 in FIG. 1B), the tapering of the profile may also be less than the prior embodiments. By performing the corrective deposition at this stage, further tapering during the patterning of the material layer 120 may advantageously be suppressed. In certain embodiments, the initial recess 335 may be shallow enough that it is not substantially tapered. In one or more embodiments, the initial recess 335 may have a depth between 40% and 60%, for example 50%, of the total thickness of the material layer 120, but in other embodiments, a different depth range may be adopted in view of the etch profile by the partial etch.

Figure 3B:
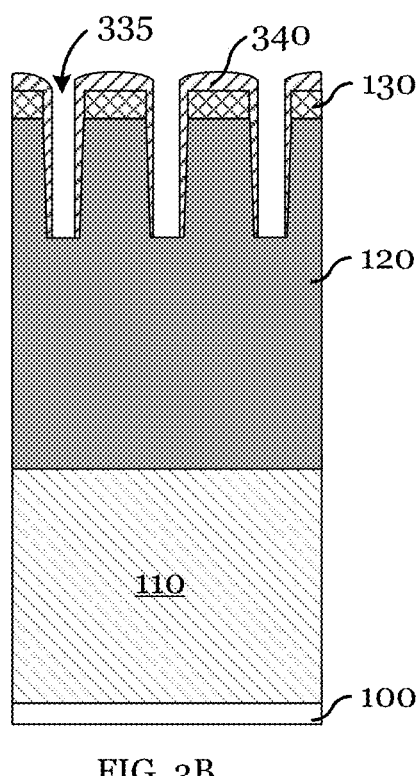

FIG. 3B illustrates a cross sectional view of the substrate 100 after a corrective deposition over the material layer 120.

A metal-containing layer 340 may be deposited over the material layer 120 by the corrective deposition. In various embodiments, the process to form the metal-containing layer 340 and the material selection may be the same as prior embodiments described above. Similar to the prior embodiments, the metal-containing layer 340 may be deposited non-conformally (top preferential) and correct the tapered or pointed profile of the material layer 120. If the initial recess 335 is not substantially tapered, the metal-containing layer 340 may be deposited conformally. In this case, the metal-containing layer 340 may not substantially change the shape of the etch mask (i.e., the material layer 120), but still improving sidewall passivation by the metal compound used for the metal-containing layer 340.

As illustrated in FIG. 3B, the metal-containing layer 340 may also cover the top surface of the remaining portion of the patterned mask layer 130. Although not wishing to be limited by any theory, this may benefit the mask selectivity during the etching of the material layer 120.

Figure 3C:
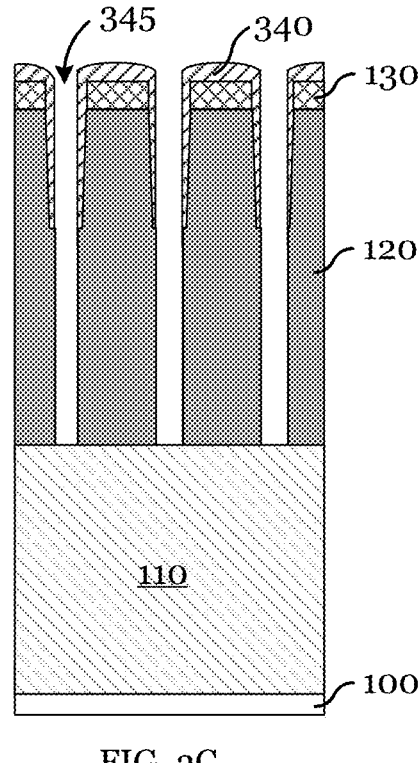

FIG. 3C illustrates a cross sectional view of the substrate 100 after completing the etching of the material layer 120 to extend the initial recess 335.

After the corrective deposition, another etch may be performed to extend the initial recess 335 to form extended recess 345 that reaches the underlying layer as illustrated in FIG. 3C. Thanks to the corrective deposition after the partial etch, the extended recess 345 may have little to no tapering. As a result, the substrate 100 may be then ready to be treated by a subsequent process (e.g., a main etch to etch the underlying layer 11) immediately after completing the patterning of the material layer 120.

In FIGS. 3A-3C, the patterning of the material layer 120 is completed by two etch steps (FIGS. 3A and 3C) and the corrective deposition in between (FIG. 3B). In other embodiments, the steps of partial etch for the material layer 120 and corrective deposition may be cyclically repeated, as a cyclic plasma process, for any number of times to gradually extend the initial recess 335 step by step to reach the underlying layer 110. Accordingly, FIG. 3C may be seen as the substrate 100 after completing the final etch step for the material layer 120.

Figure 3D:
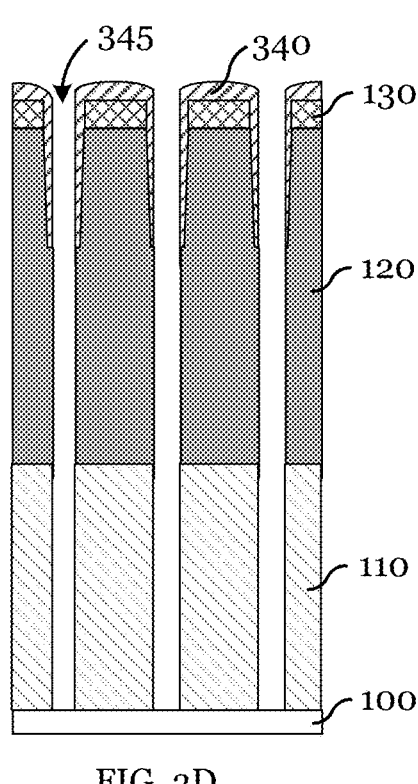

FIG. 3D illustrates a cross sectional view of the substrate 100 after a main etch to further extend the extended recess 345 in the underlying layer 110.

After completing the patterning of the material layer 120, the main etch may be performed to etch the underlying layer 110 using the material layer 120 reshaped with the metal-containing layer 140 as an etch mask to form a high aspect ratio (HAR) feature by further extending the extended recess 345. The main etch may comprise a plasma process such as reactive ion etching (RIE), and may use a halogen-containing etch gas, in the same way as described above referring to FIG. 1D.

FIGS. 4A-4D illustrate cross sectional views of a substrate during an example process of semiconductor fabrication comprising a plasma etch process to form a high aspect ratio (HAR) feature on the substrate in accordance with other embodiments.

In various embodiments, the deposition of a metal-containing layer may also be incorporated during the patterning of the underlying etch target layer (e.g., the underlying layer 110 in FIG. 1A). In particular, conformal deposition may be implemented to provide additional sidewall passivation.

Figure 4A:
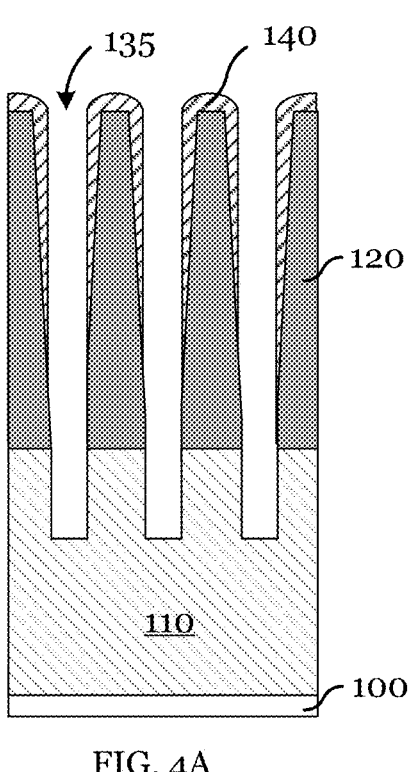

FIG. 4A illustrates a cross sectional view of a substrate 100 after an initial etch to form a recess 135 in a material layer 120, a corrective deposition, and a partial main etch to extend the recess 135 in an underlying layer 110. The corrective deposition has been performed after the initial etch, and a metal-containing layer 140 is deposited over the material layer 120. The details of these layers may be identical to those described referring to FIGS. 1A-1C, and will not be repeated. Although not specifically illustrated, in certain embodiments, the corrective deposition may be performed at a different stage of the process flow (e.g., during the patterning of the material layer 120 as illustrated in FIGS. 3A-3C), and the profile of the etch mask (i.e., the material layer 120 reshaped with the metal-containing layer 140) may have a different shape.

In various embodiments, the partial main etch may comprise a plasma process such as reactive ion etching (RIE), and may use a halogen-containing etch gas, in the same way as described above referring to FIG. 1D. As illustrated in FIG. 4A, the partial main etch may be terminated after the recess 135 is extended only partially in the underlying layer 110.

Figure 4B:
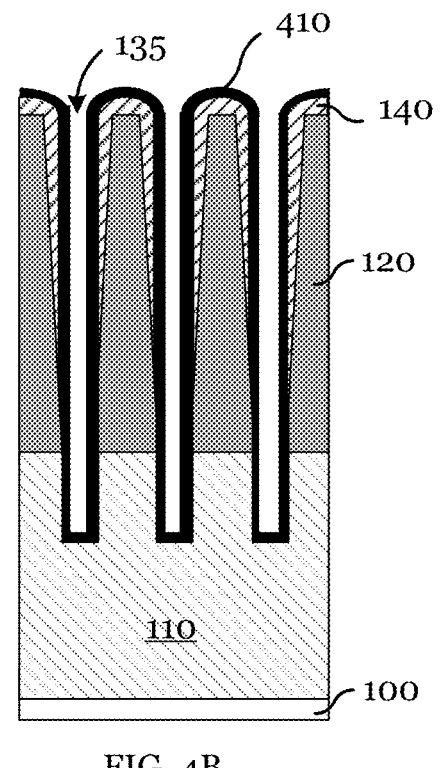

FIG. 4B illustrates a cross sectional view of the substrate 100 after a conformal deposition.

After the partial main etch, the conformal deposition may be performed to deposit a second metal-containing layer 410. In various embodiments, the second metal-containing layer 410 may comprise a compound of aluminum (Al), titanium (Ti), or tantalum (Ta). The second metal-containing layer 410 and the metal-containing layer 140 may use a same material or different materials. Similar to the metal-containing layer 140, the metal compound for the second metal-containing layer 410 may be selected in view of the volatility of a corresponding metal compound under the etching conditions during the subsequent etch process. In certain embodiments, the second metal-containing layer 410 may be in physical contact with the metal-containing layer 140, the material layer 120, and the underlying layer 110. In particular, the portion covering the sidewalls of the feature may advantageously provide sidewall passivation.

In various embodiments, the second metal-containing layer 410 may be deposited conformally rather than non-conformally. This is because the etch mask profile can be corrected by the corrective deposition for the metal-containing layer 140 already, and the main purpose of the second metal-containing layer 410 may be sidewall passivation during the main etch. Accordingly, the conformal deposition may be performed using an atomic layer deposition (ALD) tool (e.g., FIGS. 7A-7B). In various embodiments, the same spatially segregated ALD tool used for the corrective deposition may be used for the conformal deposition. The process parameters may be adjusted to enable conformal deposition (ALD process). For example, the spin rate of the substrate may be tuned to be low enough that there is no diffusion limitation in the process. In one embodiment, the thickness of the second metal-containing layer 410 has a thickness between 1 nm and 20 nm.

In one or more embodiments, although not specifically illustrated in FIG. 4B, the second metal-containing layer 410 may be deposited non-conformally in the same way as the metal-containing layer 140 to further correct the etch mask profile. Such embodiments may particularly be beneficial in case the etch mask profile may become tapered or pointed as a result of the main etch.

Figure 4C:
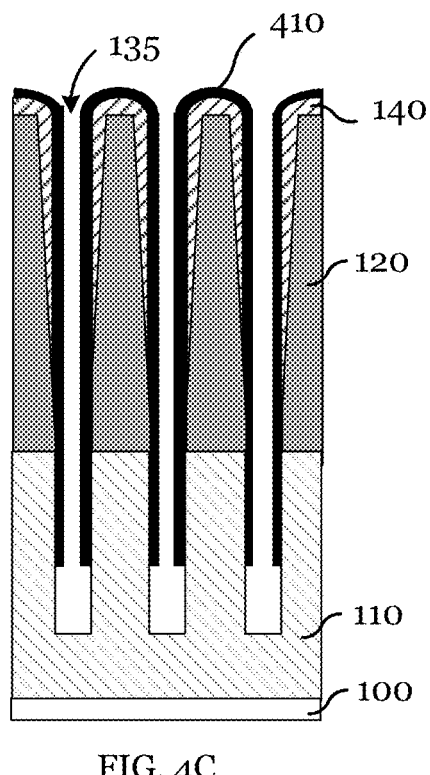

FIG. 4C illustrates a cross sectional view of the substrate 100 after another main etch to extend the recess 135 in the underlying layer 110.

After the second metal-containing layer 410 is deposited conformally or non-conformally, the main etch may be resumed or another etch process may be performed to extend the recess 135. Thanks to the additional sidewall passivation by the second metal-containing layer 410, the recess 135 may be extended with little to no bowing, maintaining critical dimension uniformity (CDU) as well.

In various embodiments, the steps of partial main etch for the underlying layer 110 and corrective or conformal deposition may be cyclically repeated, as a cyclic plasma process, for any number of times to gradually extend the initial recess

335 step by step to reach the target depth (e.g., to reach the top surface of the substrate 100).

Although FIGS. 4A-4C illustrates the embodiments of the combined use of the corrective deposition for the metal-containing layer 140 after the initial etch and the conformal deposition for the second metal-containing layer 410 during the main etch, in other embodiments, deposition of the metal-containing layer may be used only during the main etch, where the material layer 120 is not reshaped or corrected prior to the main etch. In these embodiments, the substrate 100 in FIG. 4A may not comprise the metal-containing layer 140 and only the second metal-containing layer 410 may cover the sidewalls in FIG. 4B. In yet alternate embodiments, the corrective deposition for the metal-containing layer 140 during the initial etch (e.g., FIGS. 3A-3D), rather than after the initial etch (e.g., FIGS. 1A-1D) may be combined with the conformal deposition for the second metal-containing layer 410 during the main etch. Accordingly, the shape and profile of the material layer 120 and the metal-containing layer 140 in FIG. 4A (or the absence of the metal-containing layer 140) depends on the implementation of the corrective deposition prior to the main etch.

Figure 4D:
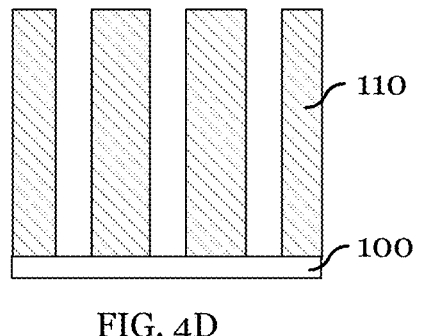

FIG. 4D illustrates a cross sectional view of the substrate 100 after completing the formation of the HAR feature and removing the material layer 120.

After completing the series of main etch to etch the underlying layer 110, any remaining mask layers (e.g., the material layer 120 and metal-containing layers) may be removed. This removal step may be performed using a dry or wet process.

FIGS. 5A-5C illustrate process flow diagrams of methods of semiconductor fabrication comprising a plasma etch process to form a HAR feature in accordance with various embodiments. The process flow can be followed with the figures discussed above (e.g., FIGS. 1B-1D and 4A-4C) and hence will not be described again.

In FIG. 5A, a process flow 50 may start with patterning a carbon-based hardmask layer disposed over a dielectric layer of a substrate to form a first recess in the carbon-based hardmask layer, where the first recess is formed to have an aspect ratio between 10:1 and 50:1 and a tapered profile such that a width of the first recess at a first height is greater than a width of the first recess at a second height that is lower than the first height (block 510, FIG. 1B). Subsequently, a metal-containing layer may be deposited over the patterned carbon-based hardmask layer such that the metal-containing layer is physically in contact with sidewalls of the patterned carbon-based hardmask layer in the first recess, and is thicker at the first height than at the second height (block 520, FIG. 1C). After depositing the metal-containing layer, the dielectric layer may then be etched using the patterned carbon-based hardmask layer as an etch mask by an anisotropic plasma etch process to form a second recess in the dielectric layer, while the metal-containing layer provides sidewall passivation during the etching (block 530, FIG. 1D).

In FIG. 5B, another process flow 52 may start with patterning a carbon-based hardmask layer disposed over a dielectric layer of a substrate to form a first recess in the carbon-based hardmask layer, where the first recess is formed to have an aspect ratio between 10:1 and 50:1 (block 512, e.g., FIG. 1B or 1C). Subsequently, an initial etch process may be performed using the patterned carbon-based hardmask layer as an etch mask to form a second recess in the dielectric layer (block 517, FIG. 4A), followed by performing an atomic layer deposition (ALD) process to deposit a metal-containing layer over sidewalls of the patterned carbon-based hardmask layer and the dielectric layer (block 522, FIG. 4B). After the ALD process, a main etch process may be performed to extend the second recess in the dielectric layer, while the metal-containing layer provides sidewall passivation during the main etch (block 532, FIG. 4C).

In FIG. 5C, another process flow 54 may start with loading the substrate in a deposition tool comprising two process sections, where the substrate comprises a patterned hardmask layer disposed over a dielectric layer (block 504, FIG. 1B). Subsequently, a metal-containing layer may be deposited over sidewalls of the patterned hardmask layer using the deposition tool (block 524, FIG. 1C) as a corrective deposition. Steps of the corrective deposition may comprise rotating the substrate at a rotation speed such that at least a portion of the substrate pass through first and second process sections of the deposition tool per rotation. During the rotation, the portion of the substrate may be exposed in the first process section to a metal-containing precursor to deposit the metal-containing precursor over the sidewalls (block 526), and the portion of the substrate may be exposed in the second process section to an activation gas to convert the metal-containing precursor to the metal-containing layer (block 528). After the corrective deposition, an anisotropic plasma etch process may be performed using the patterned hardmask layer to form a recess in the dielectric layer, while the metal-containing layer provides sidewall passivation during the anisotropic plasma etch process (block 534, FIG. 1D)

FIG. 6 illustrates a cross-sectional view of a plasma system for performing a corrective deposition in accordance with an embodiment.

FIG. 6 illustrates a plasma system 600 for performing a corrective deposition using a PECVD process. The plasma system 600 has a plasma processing chamber 650 configured to sustain plasma directly above a substrate 602 loaded onto a substrate holder 610. A process gas may be introduced to the plasma processing chamber 650 through a gas inlet 622 and may be pumped out of the plasma processing chamber 650 through a gas outlet 624. The gas inlet 622 and the gas outlet 624 may comprise a set of multiple gas inlets and gas outlets, respectively. The gas flow rates and chamber pressure may be controlled by a gas flow control system 620 coupled to the gas inlet 622 and the gas outlet 624. The gas flow control system 620 may comprise various components such as high pressure gas canisters, valves (e.g., throttle valves), pressure sensors, gas flow sensors, vacuum pumps, pipes, and electronically programmable controllers. An RF bias power source 634 and an RF source power source 630 may be coupled to respective electrodes of the plasma processing chamber 650. The substrate holder 610 may also be the electrode coupled to the RF bias power source 634. The RF source power source 630 is shown coupled to a helical electrode 632 coiled around a dielectric sidewall 616. In FIG. 6, the gas inlet 622 is an opening in a top plate 612 and the gas outlet 624 is an opening in a bottom plate 614. The top plate 612 and bottom plate 614 may be conductive and electrically connected to the system ground (a reference potential).

The plasma system 600 is by example only. In various alternative embodiments, the plasma system 600 may be configured to sustain inductively coupled plasma (ICP) with RF source power coupled to a planar coil over a top dielectric cover, or capacitively coupled plasma (CCP) sustained using a disc-shaped top electrode in the plasma processing chamber 650. Gas inlets and outlets may be coupled to sidewalls of the plasma processing chamber, and pulsed RF power sources and pulsed DC power sources may also be used in some embodiments. In other embodiments, the corrective deposition may be a non-plasma process and may still be performed using the plasma system 600 or the like without striking a plasma during the deposition.

FIGS. 7A and 7B illustrate a spatially segregated atomic layer deposition (ALD) system for performing a corrective deposition, as illustrated in the flow diagram in FIG. 5C.

FIGS. 7A and 7B illustrates a spatially segregated ALD system 700 for performing a corrective deposition, wherein FIG. 7A is a top view and FIG. 7B is a cross-sectional view. In FIG. 7A, the ALD system 700 may comprise four spatially segregated sections of a spatial processing chamber 740. The steps of corrective or conformal deposition for the metal-containing layer may be performed by moving the substrate through the four spatially segregated sections of the spatial processing chamber 740 using for example, a rotatable stage 710.

In the top view illustrated in FIG. 7A, the rotatable stage 710 is segregated into four sections, a first purge section 745, a first processing section 750, a second purge section 755, and a second processing section 760. The first and second purge sections 745 and 755 both function as inert gas curtains that separate the two processing sections 750 and 760. An inert gas (e.g., argon, helium, or $N_2$) introduced through one of gas inlets 720. Each section may comprise one or more gas inlets and outlets. In FIG. 7A, the first processing section 750 has a gas inlet 752 and a gas outlet 724, the second processing section 760 has a gas inlet 723 and a gas outlet 725, and the two purge sections 745 and 755 have gas inlets 720 and gas outlets 726. In various embodiments, the exposure to a metal-containing precursor (block 526 in FIG. 5C) may be performed in the first processing section 750, and the exposure to the activation gas (e.g., oxidative gas such as $O_2$ or nitriding gas such as $NH_3$) (block 528 in FIG. 5C) in the second processing section 760. The two purge sections 745 and 755 may be used to remove any remaining gas or gas byproducts from the previous step. In various embodiments, the purge gas may comprise a noble gas or dinitrogen ($N_2$). Using the rotatable stage 710, these steps may be cyclically repeated as a cyclic deposition process (pseudo-ALD or ALD) to gradually grow a target layer. In various embodiments, the exposure step and activation step may be performed as a plasma process or non-plasma process. In one embodiment, the exposure step may be a non-plasma process and the activation step may be a plasma process.

For example, illustrated in FIG. 7A, a plurality of substrates may be loaded on the rotatable stage 710. A first substrate 702, shown loaded on the rotatable stage 710 in the first processing section 750, may be undergoing the initial deposition step of the metal-containing precursor of the cyclic deposition process. As the rotatable stage 710 rotates, the first substrate 702 will be moved next to the second purge section 755 for purging, and then to the second processing section 760 for the activation step. Simultaneously, another substrate 704, which is positioned at the opposite side of the first substrate 702 on the rotatable stage 710 (e.g., initially in the second processing section 760 as illustrated in FIG. 7A), can also be processed while moving from the second processing section 760 to the first purge section 745, and then the first processing section 750, followed by a next rotation. Accordingly, a plurality of substrates may be undergoing different steps of the cyclic deposition process at the same time. One revolution of the rotatable stage 710 would be equivalent of performing one cycle of the cyclic deposition process.

The spatially segregated ALD system 700 may advantageously be used for non-conformal or conformal deposition. In various embodiments, process parameters, for example the spin rate to the rotatable stage 710, can be adjusted to control the level of conformality for deposition. Because the spin rate and the processing time for each step (i.e., the time for a substrate to spend in a section of the system per cycle) are inversely proportional, a higher spin rate leads to a shorter processing time. To deposit a conformal layer by vapor deposition, the precursor need to be diffused uniformly across the substrate, and this time needed for sufficient diffusion may be particularly longer in a high aspect ratio (HAR) feature. Accordingly, performing the deposition process with a high spin rate may lead to diffusion limited process. The inventors of this application demonstrated that such process conditions may advantageously be used to enable non-conformal layer growth for the purpose of corrective deposition as described above. In various embodiments, for the corrective deposition (non-conformal deposition), the spin rate may be between 30 rpm and 300 rpm. On the other hand, in certain embodiments where conformal deposition is desired (e.g., FIG. 4B), the spin rate may be low enough to ensure the deposition process is not diffusion limited. In one embodiment, the spin rate may be between 1 rpm and 100 rpm to enable conformal deposition. The range of spin rate is for example only, and in various embodiments, the rate of deposition depends on the chemistry and reactivity of the precursor and any intermediates, and therefore the corrective deposition may be performed at any reasonable spin rate. Further, in one embodiment, the process parameters such as spin rate may be dynamically changed during the process based on the progress of the process.

In various embodiments, the spatially segregated ALD system 700 may be a plasma system. For example, the first and second processing sections 750 and 760 may be each configured to sustain a plasma for processing. In other embodiments, only one of the two processing sections may be configured to sustain a plasma. Alternately, the spatially segregated ALD system 700 may be a non-plasma system without any plasma feature. In the cross-sectional view illustrated in FIG. 7B, the processing sections 750 and 760 are visible. In the example spatial processing chamber 740, the processing sections 750 and 760 are configured to sustain capacitively coupled plasma (CCP) using top electrodes 712 coupled to RF power sources 714. In the example embodiment illustrated in FIG. 7B, the rotatable stage 710 has been electrically coupled to ground. The grounded rotatable stage 710 may serve as a bottom electrode. The gas outlets 724, 725, and 726 may be connected to vacuum pumps of a gas flow system and controlled to maintain desired pressure and gas flow for the corresponding section.

The plasma system of the spatially segregated ALD system 700 as illustrated in FIG. 7B is by example only, and other plasma configuration may be used. In various alternative embodiments, the plasma system may be configured to sustain inductively coupled plasma (ICP). In other embodiments, the cyclic deposition process may be a non-plasma process and may still be performed using the spatially segregated ALD system 700 or the like without striking a plasma during the deposition.

Example embodiments of the invention are described below. Other embodiments can also be understood from the entirety of the specification as well as the claims filed herein.

Example 1. A method for processing a substrate that includes: patterning a carbon-based hardmask layer disposed over a dielectric layer of a substrate to form a first recess in the carbon-based hardmask layer, the first recess having a tapered profile such that a width of the first recess at a first height is greater than a width of the first recess at a second height that is lower than the first height; depositing a metal-containing layer over the patterned carbon-based hardmask layer, the metal-containing layer being physically in contact with sidewalls of the patterned carbon-based hardmask layer in the first recess, the metal-containing layer being thicker at the first height than at the second height; and after depositing the metal-containing layer, etching the dielectric layer using the patterned carbon-based hardmask layer as an etch mask by an anisotropic plasma etch process to form a second recess in the dielectric layer.

Example 2. The method of example 1, where depositing the metal-containing layer includes: exposing the substrate to a metal-containing precursor to deposit the metal-containing precursor over the substrate; and oxidizing or nitriding the deposited metal-containing precursor to form the metal-containing layer over the patterned carbon-based hardmask layer, the metal-containing layer including a metal oxide, metal nitride, or metal oxynitride.

Example 3. The method of one of examples 1 or 2, where the metal-precursor includes trimethylaluminum (TMA), and where the metal-containing layer includes aluminum oxide, aluminum nitride, or aluminum oxynitride.

Example 4. The method of one of examples 1 to 3, where depositing the metal-containing layer further includes repeating the steps of the exposing and the oxidizing or nitriding to grow the metal-containing layer.

Example 5. The method of one of examples 1 to 4, where a deposition tool including multiple spatially segregated sections is used to perform the exposing in a first section of the deposition tool and the oxidizing or nitriding in a second section of the deposition tool.

Example 6. The method of one of examples 1 to 5, further including: after etching the dielectric layer, conformally depositing another metal-containing layer over sidewalls of the patterned carbon-based hardmask layer and the dielectric layer; and vertically extending the second recess in the dielectric layer by another anisotropic plasma etch process, the another metal-containing layer providing sidewall passivation during vertically extending the second recess.

Example 7. The method of one of examples 1 to 6, where the metal-containing layer includes titanium oxide or titanium nitride.

Example 8. The method of one of examples 1 to 7, where the anisotropic plasma etch process uses fluorine, and where the metal-containing layer after etching the dielectric layer includes a metal fluoride.

Example 9. The method of one of examples 1 to 8, further including, after etching the dielectric layer, removing the patterned carbon-based hardmask layer and the metal-containing layer.

Example 10. A method for processing a substrate that includes: patterning a carbon-based hardmask layer disposed over a dielectric layer of a substrate to form a first recess in the carbon-based hardmask layer, the first recess having an aspect ratio between 10:1 and 50:1; performing an initial etch process using the patterned carbon-based hardmask layer as an etch mask to form a second recess in the dielectric layer; performing an atomic layer deposition (ALD) process to deposit a metal-containing layer over sidewalls of the patterned carbon-based hardmask layer and the dielectric layer; and after the ALD process, performing a main etch process to extend the second recess in the dielectric layer, the metal-containing layer providing side-wall passivation during the main etch.

Example 11. The method of example 10, further including, prior to the initial etch process, depositing another metal-containing layer over the patterned carbon-based hardmask layer, the another metal-containing layer being physically in contact with the patterned carbon-based hardmask layer.

Example 12. The method of one of examples 10 or 11, where the metal-containing layer is deposited conformally and the another metal-containing layer is deposited non-conformally.

Example 13. The method of one of examples 10 to 12, where patterning the carbon-based hardmask layer includes: forming an initial recess in the carbon-based hardmask layer; depositing another metal-containing layer over side-walls of the patterned carbon-based hardmask layer in the initial recess, the another metal-containing layer being physically in contact with the patterned carbon-based hardmask layer; and extending the initial recess to form the first recess.

Example 14. The method of one of examples 10 to 13, where the carbon-based hardmask layer includes amorphous carbon layer (ACL), where the metal-containing layer includes aluminum or titanium, and where the dielectric layer includes silicon oxide or silicon nitride.

Example 15. A method for processing a substrate that includes: loading the substrate in a deposition tool including two process sections, the substrate including a patterned hardmask layer disposed over a dielectric layer; depositing a metal-containing layer over sidewalls of the patterned hardmask layer using the deposition tool, the depositing including rotating the substrate at a rotation speed such that at least a portion of the substrate pass through first and second process sections of the deposition tool per rotation, the rotating including exposing the portion of the substrate in the first process section to a metal-containing precursor to deposit the metal-containing precursor over the sidewalls, and exposing the portion of the substrate in the second process section to an activation gas to convert the metal-containing precursor to the metal-containing layer; and performing an anisotropic plasma etch process using the patterned hardmask layer to form a recess in the dielectric layer, the metal-containing layer providing sidewall passivation during the anisotropic plasma etch process.

Example 16. The method of example 15, where the activation gas includes oxygen or nitrogen, and where the metal-containing layer includes a metal oxide, metal nitride, or metal oxynitride.

Example 17. The method of one of examples 15 or 16, where the deposition tool further includes first and second purge sections, each of the purge sections separating the first and second process sections, and where the rotating further includes: exposing the portion of the substrate in the first purge section to a first purge gas; and exposing the portion of the substrate in the second purge section to a second purge gas.

Example 18. The method of one of examples 15 to 17, where the first or second purge gas includes a noble gas or dinitrogen ($N_2$).

Example 19. The method of one of examples 15 to 18, where the rotation speed is between 30 rpm and 300 rpm.

Example 20. The method of one of examples 15 to 19, further including selecting the rotation speed such that the metal-containing layer is deposited non-conformally over the sidewalls, where the metal-containing layer is thicker near the top than near the bottom.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
   patterning a hardmask layer disposed over a dielectric layer of a substrate to form a first recess in the hardmask layer, the first recess having a tapered profile such that a width of the first recess at a first height is greater than a width of the first recess at a second height that is lower than the first height;
   depositing a metal-containing layer over the patterned hardmask layer, the metal-containing layer being disposed over sidewalls of the patterned hardmask layer in the first recess, the metal-containing layer being thicker at the first height than at the second height; and
   after depositing the metal-containing layer, etching the dielectric layer using the patterned hardmask layer as an etch mask by an anisotropic plasma etch process to form a second recess in the dielectric layer.

2. The method of claim 1, wherein depositing the metal-containing layer comprises:
   exposing the substrate to a metal-containing precursor to deposit the metal-containing precursor over the substrate; and
   oxidizing or nitriding the deposited metal-containing precursor to form the metal-containing layer over the patterned hardmask layer, the metal-containing layer comprising a metal oxide, metal nitride, or metal oxynitride.

3. The method of claim 2, wherein the metal-containing precursor comprises trimethylaluminum (TMA), and wherein the metal-containing layer comprises aluminum oxide, aluminum nitride, or aluminum oxynitride.

4. The method of claim 2, wherein depositing the metal-containing layer further comprises repeating the steps of the exposing and the oxidizing or nitriding to grow the metal-containing layer.

5. The method of claim 4, wherein a deposition tool comprising multiple spatially segregated sections is used to perform the exposing in a first section of the deposition tool and the oxidizing or nitriding in a second section of the deposition tool.

6. The method of claim 1, further comprising:
   after etching the dielectric layer, conformally depositing another metal-containing layer over the sidewalls of the patterned hardmask layer and the dielectric layer; and
   vertically extending the second recess in the dielectric layer by another anisotropic plasma etch process, the another metal-containing layer providing sidewall passivation during vertically extending the second recess.

7. The method of claim 1, wherein the metal-containing layer comprises titanium oxide or titanium nitride.

8. The method of claim 1, wherein the anisotropic plasma etch process uses fluorine, and wherein the metal-containing layer after etching the dielectric layer comprises a metal fluoride.

9. The method of claim 1, further comprising, after etching the dielectric layer, removing the patterned hardmask layer and the metal-containing layer.

10. The method of claim 1, wherein the hardmask layer is a carbon-based hardmask layer, and wherein the metal-containing layer is physically in contact with the sidewalls of the patterned hardmask layer in the first recess.

11. A method for processing a substrate, the method comprising:
  patterning a hardmask layer disposed over a dielectric layer of a substrate to form a first recess in the hardmask layer, the first recess having an aspect ratio between 10:1 and 50:1;
  performing an initial etch process using the patterned hardmask layer as an etch mask to form a second recess in the dielectric layer;
  performing an atomic layer deposition (ALD) process to deposit a metal-containing layer over sidewalls of the patterned hardmask layer and the dielectric layer; and
  after the ALD process, performing a main etch process to extend the second recess in the dielectric layer, the metal-containing layer providing sidewall passivation during the main etch.

12. The method of claim 11, further comprising, prior to the initial etch process, depositing another metal-containing layer over the patterned hardmask layer, the another metal-containing layer being physically in contact with the patterned hardmask layer.

13. The method of claim 12, wherein the metal-containing layer is deposited conformally and the another metal-containing layer is deposited non-conformally.

14. The method of claim 11, wherein patterning the hardmask layer comprises:
  forming an initial recess in the hardmask layer;
  depositing another metal-containing layer over the sidewalls of the patterned hardmask layer in the initial recess, the another metal-containing layer being physically in contact with the patterned hardmask layer; and
  extending the initial recess to form the first recess.

15. The method of claim 11, wherein the hardmask layer comprises an amorphous carbon layer (ACL), wherein the metal-containing layer comprises aluminum or titanium, and wherein the dielectric layer comprises silicon oxide or silicon nitride.

16. The method of claim 11, wherein the hardmask layer is a carbon-based hardmask layer.

17. A method for processing a substrate, the method comprising:
  loading the substrate in a deposition tool comprising two process sections, the substrate comprising a patterned hardmask layer disposed over a dielectric layer;
  depositing a metal-containing layer over sidewalls of the patterned hardmask layer using the deposition tool, the depositing comprising rotating the substrate at a rotation speed such that at least a portion of the substrate passes through first and second process sections of the deposition tool per rotation, the rotating comprising

20 exposing the portion of the substrate in the first process section to a metal-containing precursor to deposit the metal-containing precursor over the sidewalls, and
  exposing the portion of the substrate in the second process section to an activation gas to convert the metal-containing precursor to the metal-containing layer; and
  performing an anisotropic plasma etch process using the patterned hardmask layer to form a recess in the dielectric layer, the metal-containing layer providing sidewall passivation during the anisotropic plasma etch process.

18. The method of claim 17, wherein the activation gas comprises oxygen or nitrogen, and wherein the metal-containing layer comprises a metal oxide, metal nitride, or metal oxynitride.

19. The method of claim 17, wherein the deposition tool further comprises first and second purge sections, each of the purge sections separating the first and second process sections, and wherein the rotating further comprises:
  exposing the portion of the substrate in the first purge section to a first purge gas; and
  exposing the portion of the substrate in the second purge section to a second purge gas.

20. The method of claim 19, wherein the first or second purge gas comprises a noble gas or dinitrogen ($N_2$).

21. The method of claim 17, wherein the rotation speed is between 30 rpm and 300 rpm.

22. The method of claim 17, further comprising selecting the rotation speed such that the metal-containing layer is deposited non-conformally over the sidewalls, wherein the metal-containing layer is thicker near the top than near the bottom.

23. A deposition system comprising:
  a process chamber;
  a rotatable substrate holder configured to hold a substrate comprising a patterned hardmask layer with a recess having a tapered profile;
  a first process section disposed in the process chamber and configured to supply a metal-containing precursor; and
  a second process section disposed in the process chamber and configured to supply an activation gas, the second process section being spatially segregated from the first process section; wherein the rotatable substrate holder is configured to rotate at a rotation speed such that the metal-containing precursor is deposited non-conformally over sidewalls of the recess, with greater thickness at a first height than at a second height lower than the first height, to correct the tapered profile of the patterned hardmask layer.

* * * * *